United States Patent
Kar et al.

(10) Patent No.: US 11,470,431 B1
(45) Date of Patent: Oct. 11, 2022

(54) CONFIGURABLE POWER DELIVERY FOR PORTABLE DEVICES

(71) Applicant: Amazon Technologies, Inc., Seattle, WA (US)

(72) Inventors: Sagnik Kar, Livermore, CA (US); Jose Octavio Escobar, Union City, CA (US)

(73) Assignee: Amazon Technologies, Inc., Seattle, WA (US)

( * ) Notice: Subject to any disclaimer, the term of this patent is extended or adjusted under 35 U.S.C. 154(b) by 0 days.

(21) Appl. No.: 16/564,930

(22) Filed: Sep. 9, 2019

(51) Int. Cl.
*H04R 29/00* (2006.01)
*H02M 3/155* (2006.01)
*H04R 3/00* (2006.01)
*H03F 3/183* (2006.01)

(52) U.S. Cl.
CPC .......... *H04R 29/001* (2013.01); *H02M 3/155* (2013.01); *H03F 3/183* (2013.01); *H04R 3/00* (2013.01); *H03F 2200/03* (2013.01); *H04R 2499/11* (2013.01)

(58) Field of Classification Search
CPC ........ H04R 3/007; H04R 29/001; H04R 3/00; H04R 1/1041; H04R 2430/01; H04R 2460/03; H04R 3/04; H04R 9/06; H04R 1/00; H04R 2400/00; H04R 2499/11; H03G 9/025; H03G 3/007; H03G 3/3005; H03G 3/301; H03G 3/3089; H03G 5/005; H03G 5/165; H03G 3/344; H03G 11/02; H03G 1/0047; H03G 3/34; H03G 3/341; H03G 7/002; H03G 7/02; H04N 1/00132; H04N 5/213; H04N 5/53; H04N 5/57; H04H 60/58; H04W 88/027
USPC ...................................... 381/56–58, 74, 123
See application file for complete search history.

(56) References Cited

U.S. PATENT DOCUMENTS

| | | | | |
|---|---|---|---|---|
| 8,073,158 | B2 * | 12/2011 | Liu | H04R 3/007 381/94.5 |
| 9,191,728 | B2 * | 11/2015 | Savant | H04R 1/1025 |
| 2011/0075454 | A1 * | 3/2011 | Jones | H02M 3/22 363/67 |
| 2015/0200640 | A1 * | 7/2015 | Hogan | H03G 3/20 381/108 |
| 2017/0324321 | A1 * | 11/2017 | Hoyerby | H03F 3/217 |
| 2017/0359652 | A1 * | 12/2017 | Serwy | H03F 3/183 |
| 2020/0382078 | A1 * | 12/2020 | Hoff | H03G 3/007 |

* cited by examiner

*Primary Examiner* — Lun-See Lao
(74) *Attorney, Agent, or Firm* — Kilpatrick Townsend & Stockton LLP

(57) ABSTRACT

Techniques are described for dynamically changing a power draw from a power source of a portable device based on an audio output of the portable device. In an example, the portable device determines that an audio signal to be output by the portable device is associated with an audio mode. The portable device sets a voltage of a power converter of the portable device to a voltage level based at least in part on the audio mode. An amount of power is supplied from a power source of the portable device to the power converter based at least in part on the voltage level. In addition, the portable device outputs the audio signal based at least in part on the amount of power.

20 Claims, 11 Drawing Sheets

US 11,470,431 B1

CONFIGURABLE POWER DELIVERY FOR PORTABLE DEVICES

BACKGROUND

Portable devices are gaining popularity due in part to their advanced functionalities and improved battery life. Generally, a portable device is a computing device that has an internal power source for supplying power to various components of the computing device. These components are configured to provide different functionalities. The internal power source can be replaced or recharged from an external power source and/or the external power source can be electrically coupled with the portable device to provide additional power. In an example, a portable speaker represents a portable device that includes a speaker, audio processing circuitry, and a set of direct current (DC) batteries. The portable speaker can be operated to play audio without being plugged into a wall outlet. The DC batteries can be replaced or, if rechargeable, can be recharged from the wall outlet.

However, functionalities of a portable device can impact how power is drawn from the internal power source. Conversely, the configuration of the internal power source may limit how the power is drawn, thereby potentially impacting the available functionalities. For example and referring back to the portable speaker, how power can be drawn from the DC batteries can impact the audio performance.

BRIEF DESCRIPTION OF THE DRAWINGS

Various embodiments in accordance with the present disclosure will be described with reference to the drawings, in which.

DETAILED DESCRIPTION

Figure 1:
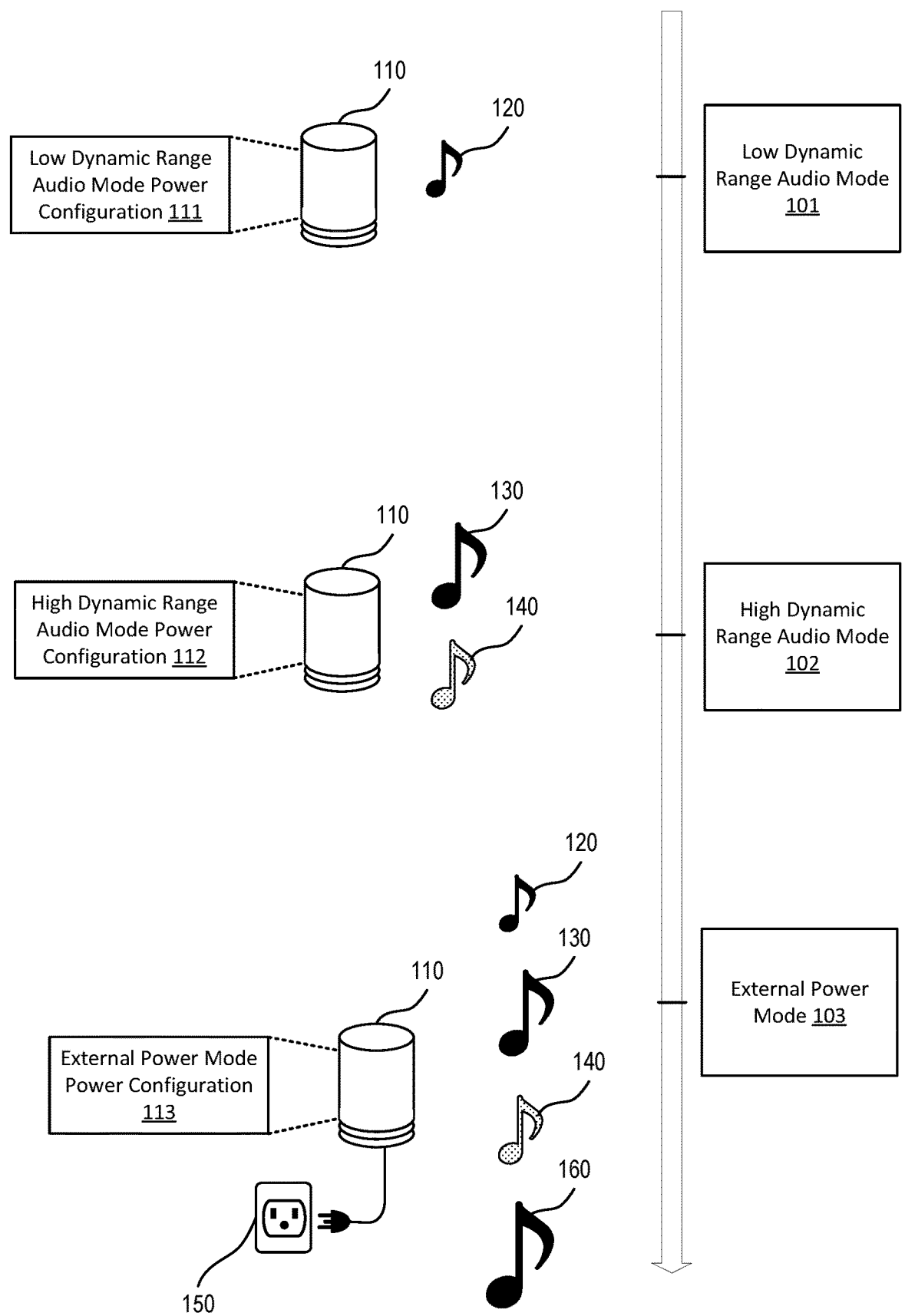
FIG. 1 illustrates an example of a portable device that is configured to dynamically change the power configuration based on an audio mode, according to embodiments of the present disclosure.

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiment being described.

Embodiments of the present disclosure are directed to, among other things, improving the power configuration of a portable device. A power draw from an internal power source of the portable device is dynamically changed based on an output of the portable device. The power draw optimizes the output performance.

In an example, the portable device outputs an audio signal from a speaker. The portable device determines that the audio signal is associated with an audio mode. Based on the audio mode, the portable device determines a particular power configuration including, for instance, a target voltage level and/or current draw for an optimal audio performance. One or more electrical components of the portable device are set to draw power from the internal power source according to the target voltage level and/or current draw. Hence, the power draw is dynamically optimized for the audio mode such that the audio performance is improved.

To illustrate, consider an example of a portable speaker. The portable speaker includes a set of DC batteries in series, a multi-stage power converter having an input electrically coupled with the set of DC batteries, a set of switches electrically coupled with outputs of the multi-stage power converter, an audio amplifier having an input electrically coupled with the set of switches, and a speaker electrically coupled with an output of the audio amplifier. The portable speaker also includes a microcontroller that controls the power configuration and an audio mode detector that detects the audio mode.

In this illustrative example, the audio mode detector detects whether the loudness of the audio signal is greater than a loudness threshold and/or whether a frequency of the audio signal is less than a predefined frequency. If greater than the loudness threshold and/or less than the predefined frequency, the audio mode corresponds to a high dynamic range (e.g., loud audio and/or bass frequency). Otherwise, the audio mode corresponds to a low dynamic range (e.g., typical voice and/or music presentation). For a louder response, the audio performance can be improved by a higher voltage. For a deeper bass response, the audio performance can be improved by a higher instantaneous current. Accordingly, upon a detection of the high dynamic range, the microcontroller receives an input indicating the high dynamic range. In response, the microcontroller generates an output indicating an increased voltage level at an output of the multi-stage converter and indicating a switch state that would trigger an increased instantaneous current draw. The combination of the voltage level and current draw represents an optimized power draw for the dynamic range. The voltage level and the switch state can be predefined and stored as part of the control logic of the microcontroller. The set of switches are switched according to the switch state to electrically couple the audio amplifier to the relevant stage of the multi-stage power converter and power is drawn by the multi-stage power converter according to the voltage level and the current draw. Hence, an optimized power draw is possible to then amplify and output the audio signal in the high dynamic range.

In addition, the portable speaker includes a power detector that detects whether an external power source is electrically coupled with the portable device. Upon a detection of such an electrical coupling, the microcontroller receives an input indicating that the external power source is available. In response, the microcontroller generates an output that indicates a change to the voltage level and switch state, resulting in a different power configuration optimized given the availability of the external power source.

Embodiments of the present disclosure provide various advantages over existing portable devices. For example and referring back to the audio performance, in existing portable speakers, the voltage level is typically fixed and the power draw can be changed by changing the instantaneous current draw. Accordingly, supporting the high dynamic range can be limited (e.g., the loudness response may not be optimal) and the instantaneous current draw can impact the battery life. In comparison, in various embodiments, the power draw can be changed by changing the voltage level and, as applicable, the current draw. In this way, the battery life can be improved, in addition to improving the audio performance in the high dynamic range.

In the interest of clarity of explanation, various embodiments are described in connection with audio modes. However, the embodiments are not limited to audio modes and similarly apply to other output modes supported by a portable device.

FIG. 1 illustrates an example of a portable device 110 that is configured to dynamically change the power configuration based on an audio mode, according to embodiments of the present disclosure. As illustrated, the portable device 110 outputs audio signals in different modes according to different power configurations. In particular, in a low dynamic range audio mode 101, the portable device 110 outputs an audio signal 120 that is not too loud and that does not have a bass, where this audio signal 120 is output according to a low dynamic range audio mode power configuration 111. Upon a change to a high dynamic range audio mode 102, the portable device 110 outputs an audio signal 130 that is loud and/or an audio signal 140 that has a bass frequency, where these audio signals 130 and 140 are output according to a high dynamic range audio mode power configuration 112. Upon a change to an external power mode 103 where an external power source 150 is electrically coupled with and supplying power to the portable device 110, the portable device 110 outputs any of the audio signals 120, 130, 140, and 160 according to an external power mode power configuration 113. In each of these modes 101, 102, and 103, the corresponding power configuration 111, 112, or 113 improves the audio performance.

In an example, the portable device 110 represents a computing device that includes an internal power source that can power various components of the computing device absent an external power source. Hence, the computing can be mobile (e.g., moved between locations) while still being powered on and operational. For instance, the computing device can be any of a portable speaker, a mobile phone, a tablet, a laptop, a smartwatch, a portable smart appliance, or a portable internet of things (JOT) device or any other portable user device.

A mode represents a set of conditions under which the portable device 110 can be operational. In particular, the low dynamic range audio mode 101 represents an audio mode in which an audio signal to be output by the portable device 110 (e.g., the audio signal 120) is not too loud and does not include a bass frequency. Loudness can be defined relative to a reference audio signal. For example, if the difference between a peak amplitude of the audio signal and the peak amplitude of the reference audio signal is less than a loudness level (e.g., a predefined loudness threshold that indicates a high output audio volume), the audio signal is determined to be not too loud. The predefined loudness threshold can be tunable. Further, the audio reference signal can be changed. The bass frequency represents a frequency lower than a frequency threshold, such as a predefined frequency, such as 250 Hz. If the pitch of the audio signal is outside of a range of bass frequencies of 60 Hz to 250 Hz (e.g., is greater than the predefined frequency of 250 Hz), the audio signal does not include a bass frequency. In comparison, the high dynamic range audio mode 102 represents an audio mode in which an audio signal to be output by the portable device is too loud (e.g., the audio signal 130), includes a bass frequency (e.g., the audio signal 130 has a frequency within the bass frequency range, such as between 60 Hz and 250 Hz), or is too loud and includes the bass frequency (e.g., the audio signals 130 and 140 are a same audio signal). Here, if the difference between the peak amplitude of the audio signal and the peak amplitude of the reference audio signal is greater than the predefined loudness threshold, the audio signal is determined to be too loud. Additionally, if the pitch of the audio signal is less than the predefined frequency, the audio signal includes a bass frequency.

The external power mode 103 represents a mode in which the portable device 110 is electrically coupled with the external power source 150 and power is supplied from the external power source 150 to the portable device 110. The external power mode 103 can include any of the low dynamic range audio mode 101 (e.g., the external power source 150 is available and the audio signal to be output from the portable device 110 is not too loud and does not include a bass frequency, such as the audio signal 120) and the high dynamic range audio mode 102 (e.g., the external power source 150 is available and the audio signal to be output from the portable device 110 is too loud and/or includes a bass frequency, such as the audio signals 130 and 140). In addition, under the external power mode 103, the audio signal 160 can be output and can be louder than the audio signal 130 because external power is available to the portable device 110. In other words, the external power mode 103 can support a higher dynamic range audio mode.

A power configuration represents a configuration of the portable device 110 for drawing power from a power source (e.g., from its internal power source and/or from the external power source 150 as applicable). In an example, each of the power configurations 111, 112, and 113 includes a voltage level and a switch state to use by the portable device 110, where the switch state results in a particular current draw from the power source. The combination of the voltage level and current draw represents an optimized power draw given the applicable mode and the need to output the relevant audio signal. The various voltage levels and switch states can be stored as part of the control logic of a microcontroller of the portable device 110 and can be selected and used depending on a detection of the modes 101, 102, and 103, as further described in connection with the next figures.

Hence, upon detection that the low dynamic range audio mode 101 is applicable, the portable device 110 uses the low dynamic range audio mode power configuration 111 optimized for this mode 101 to output the audio signal 120.

Upon detection that the high dynamic range audio mode 102 is applicable, the portable device 110 dynamically changes its power configuration to the high dynamic range audio mode power configuration 112 optimized for this mode 102 to output the audio signals 130 and/or 140. Upon detection that the external power mode 103 is applicable, the portable device 110 dynamically changes its power configuration to the external power mode power configuration 113 optimized for this mode 103 to output the audio signals 120, 130 and/or 140. Of course, the dynamic change can be between in order of the modes 101, 102, and 103, such as from the high dynamic range audio mode 102 to the low dynamic range audio mode 101.

Figure 2:
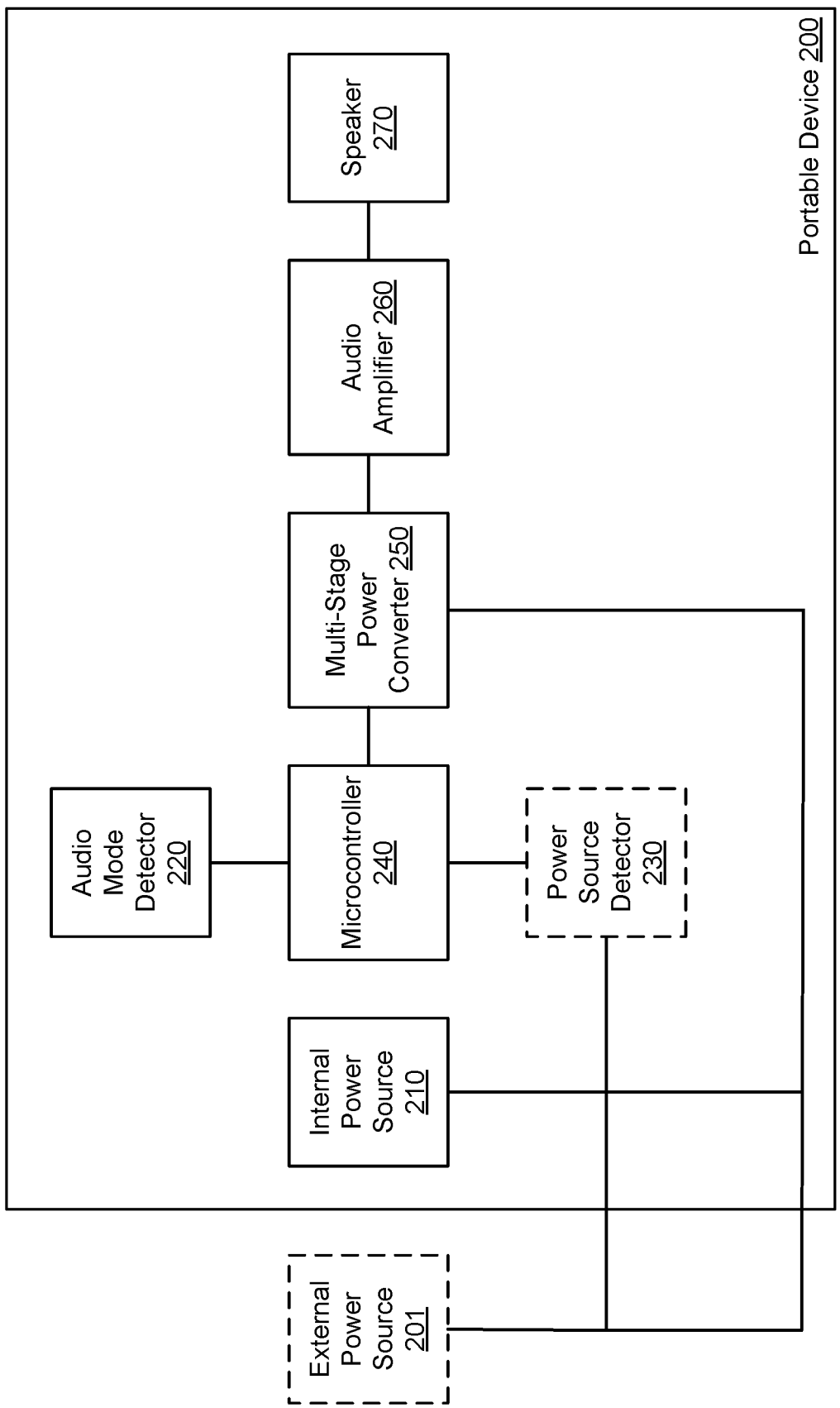
FIG. 2 illustrates an example of a configuration of a portable device, according to embodiments of the present disclosure.

FIG. 2 illustrates an example of a configuration of a portable device 200, according to embodiments of the present disclosure. The portable device 200 is an example of the portable device 110 of FIG. 1. As illustrated, the portable device 200 includes multiple components, such as an internal power source 210, an audio mode detector 220, a microcontroller 240, a multi-stage power converter 250, an audio amplifier 260, and a speaker. Optionally, an external power source 201 can be electrically coupled to the portable device 200 to recharge the internal power source 210 and/or to supply additional electrical power. In this case, the portable device 200 optionally includes a power source detector 230.

The internal power source 210 provides electrical power to the components of the portable device 200. In an example, the internal power source 210 is a set of DC batteries. The batteries may be rechargeable.

The audio mode detector 220 detects the audio mode associated with the audio that is output from the portable device 200. In an example, the audio mode detector 220 analyzes an audio signal that is to be output from the portable device 200. The audio signal can be analog. In this case, the analysis can consider the envelope of the audio signal and the frequency.

The power source detector 230 detects whether the external power source 201 is electrically coupled with the portable device 200 or not. The detection can be based on whether an electrical connection exists between the external power source 201 and the portable device 200.

The microcontroller 240 receives, as input, the output of the audio mode detector 220 (e.g., an indication of the audio mode) and, optionally, the output of the power source detector 230 (e.g., whether the external power source 201 is electrically coupled). The microcontroller 240 stores logic that, depending on the input, generates an output that sets a power configuration of the portable device 200. In an example, the power configuration indicates one or more voltage levels to set at one or more outputs corresponding to one or more stages of the multi-stage power converter 250. The power configuration also indicates that one or more of the stages that should be active by having their switch(es) in an "on" state, thereby electrically coupling the stage(s) with the audio amplifier 260. An example of the microcontroller 240 is further illustrated in FIG. 3.

The multi-stage power converter 250 includes multiple power converters that form stages, where each stage includes one or more of the power converters. Some or all of these power converters can be DC-to-DC converters, such as step-up and step-down DC converters, arranged in series and/or in parallel. Each stage has an input and an output. The input can be electrically coupled another stage and/or to the internal power source 210 and/or the external power source 201. The output can be electrically coupled with another stage or directly with the audio amplifier 260. The direct electrical coupling with the audio amplifier 260 can rely on a set of switches that are included in the multi-stage power converter 250. An example of the multi-stage power converter 250 is further illustrated in FIG. 4.

The audio amplifier 260 amplifies the audio signal according to the voltage level that is output from the multi-stage power converter 250 and current draw through the multi-stage power converter 250. The amplified audio signal is received by the speaker that outputs it as audio from the portable device 200.

Figure 3:
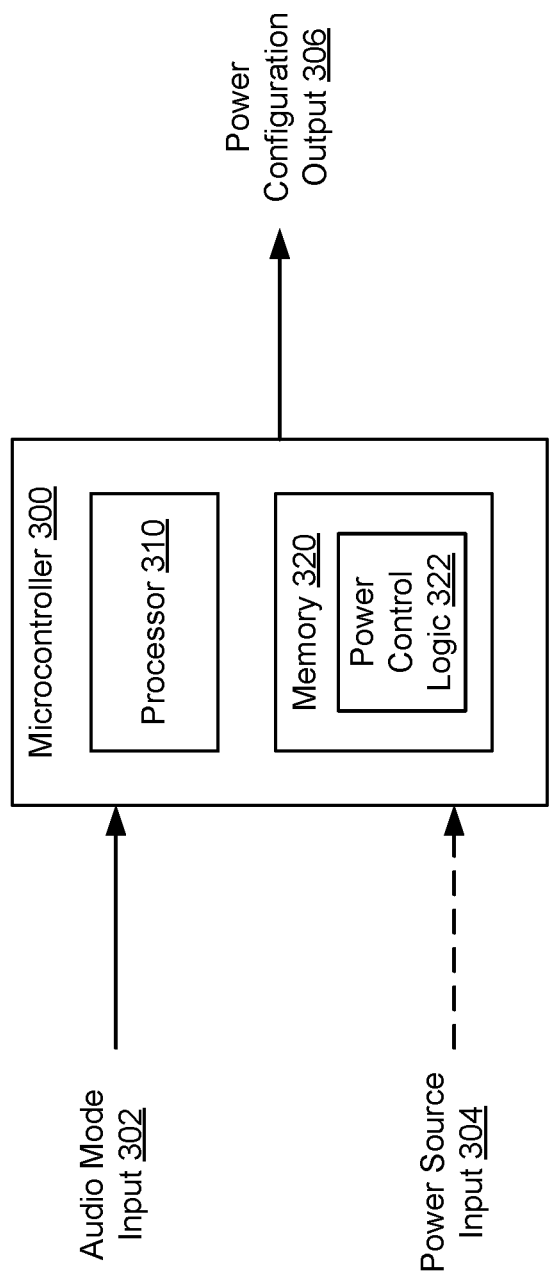
FIG. 3 illustrates an example of a microcontroller of a portable device, according to embodiments of the present disclosure.

FIG. 3 illustrates an example of a microcontroller 300 of a portable device, according to embodiments of the present disclosure. The microcontroller 300 is an example of the microcontroller 240 of FIG. 2. As illustrated, the microcontroller 300 includes a processor 310 and a memory 320. The memory 320 can be a non-transitory computer-readable medium that stores instructions executable by the processor 310. The instructions implement logic to set a power configuration of the portable device. The logic can define voltage levels and switch states depending on audio modes and, optionally, availability of one or more external power sources.

In an example, the microcontroller 300 receives an audio mode input 302 indicating an audio mode of the portable device. Optionally, the microcontroller 300 receives a power source input 304 indicating whether an external power source is electrically coupled with the portable device. The audio mode input 302 and, as applicable, the power source input 304 are processed to determine the relevant voltage level and switch state and generate a corresponding power configuration output 306. The power configuration output 306 indicates such voltage level and switch state.

To illustrate, the audio mode input 302 is a logic input "C," where a value of "1" indicates a high dynamic range audio mode and a value of "0" indicates a low dynamic range audio mode. Similarly, the power source input 304 is a logic input "B," where a value of "1" indicates the availability of an external power source and a value of "0" indicates otherwise. For each combination of "C" and "B," the logic identifies voltage levels (e.g., 0V, 20V, 35V, 60V, etc.) for outputs of stages of a multi-stage power converter of the portable device. In addition, the logic identifies the switch states that electrically couple the stages with an audio amplifier of the portable device. An illustrative example of such logic is further described in connection with FIG. 7.

Figure 4:
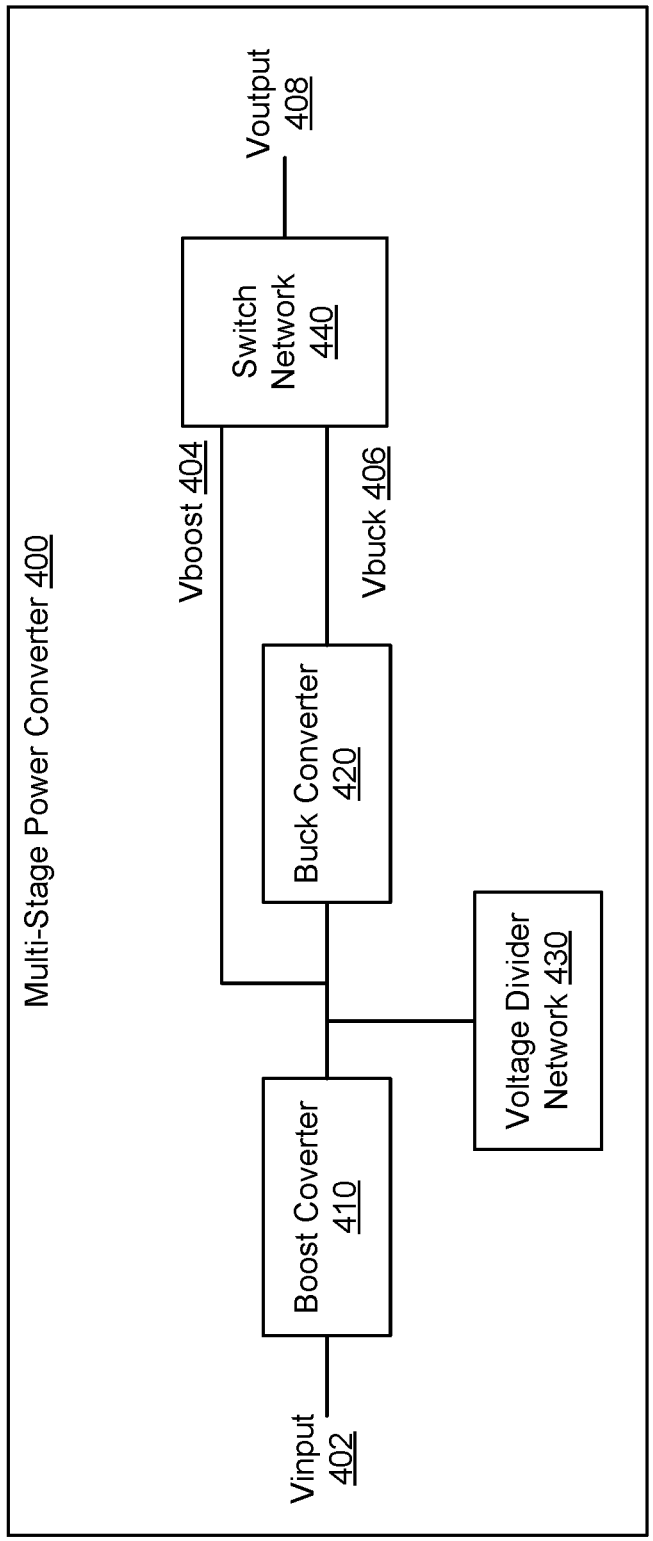
FIG. 4 illustrates an example of a multi-stage power converter of a portable device, according to embodiments of the present disclosure.

FIG. 4 illustrates an example of a multi-stage power converter 400 of a portable device, according to embodiments of the present disclosure. The multi-stage power converter 400 is an example of the multi-stage power converter 250 of FIG. 2. In the illustrative example of FIG. 4, the multi-stage power converter 400 is a DC-to-DC power converter that includes two stages: a first stage that involves a boost converter 410 and a second stage that involves the boost converter 410 and a buck converter 420. In addition, the multi-stage power converter 400 includes a voltage divider network 430 to vary the voltage level within the multi-stage power converter and a switch network 440 to switch between the outputs of the stages such that an audio amplifier can be electrically coupled with one of the outputs.

The boost converter 410 is a DC-to-DC power that steps up voltage from its input to its output. The input can be connected to an internal power source of the portable device and/or an external power source electrically coupled with the portable device. The voltage at the input of the boost converter 410 is shown as $V_{input}$ 402 and corresponds to the voltage level of the internal power source and/or external power source. The output of the boost converter 410 is connected with the voltage divider network 430. The voltage divider network 430 includes multiple voltage dividers to change the output voltage of the boost converter 410 (this output voltage is shown as $V_{boost}$ 404). For example, based on an output from a microcontroller of the portable device indicating a voltage level (e.g., 20V, 35V, 60V), the voltage divider network 430 activates (e.g., via switches) one or more of the voltage dividers to set $V_{boost}$ 404 to the voltage level (e.g., $V_{boost}$ 404 set to 20V, 35V, 60V as applicable). The boost converter 410 and the voltage divider network 430 represent the first stage. The output of this first stage (e.g., having the voltage $V_{boost}$ 404) is connected to the switch network 440 and to the buck converter 420. The boost converter 410, the voltage divider network 430, and the buck converter 420 represent the second stage. The buck converter 420 is a DC-to-DC power that steps down voltage from its input to its output (e.g., from $V_{boost}$ 404 to $V_{buck}$ 406). The output of the buck converter 420 (e.g., of the second stage) is also connected to the switch network 440. The voltage at this output is shown as $V_{buck}$ 406. The switch network 440 includes a set of switches (e.g., two switches) to switch on and off the output of the first stage and the output of the second stage. The output from the switch network represents the output of the multi-stage power converter 400. The voltage at this output is shown as $V_{output}$ 406.

Hence, given $V_{input}$ 402 at the input of the multi-stage power convert 400, $V_{output}$ 408 can be output from the multi-stage power convert 400, where $V_{output}$ 408 can be equal to $V_{boost}$ 404 or to $V_{buck}$ 406 depending on the switch states of the switch network 440. The switch states and the voltage level of $V_{boost}$ 404 (e.g., through the voltage divider network 430) can be set based on the output from the microcontroller.

Figure 5:
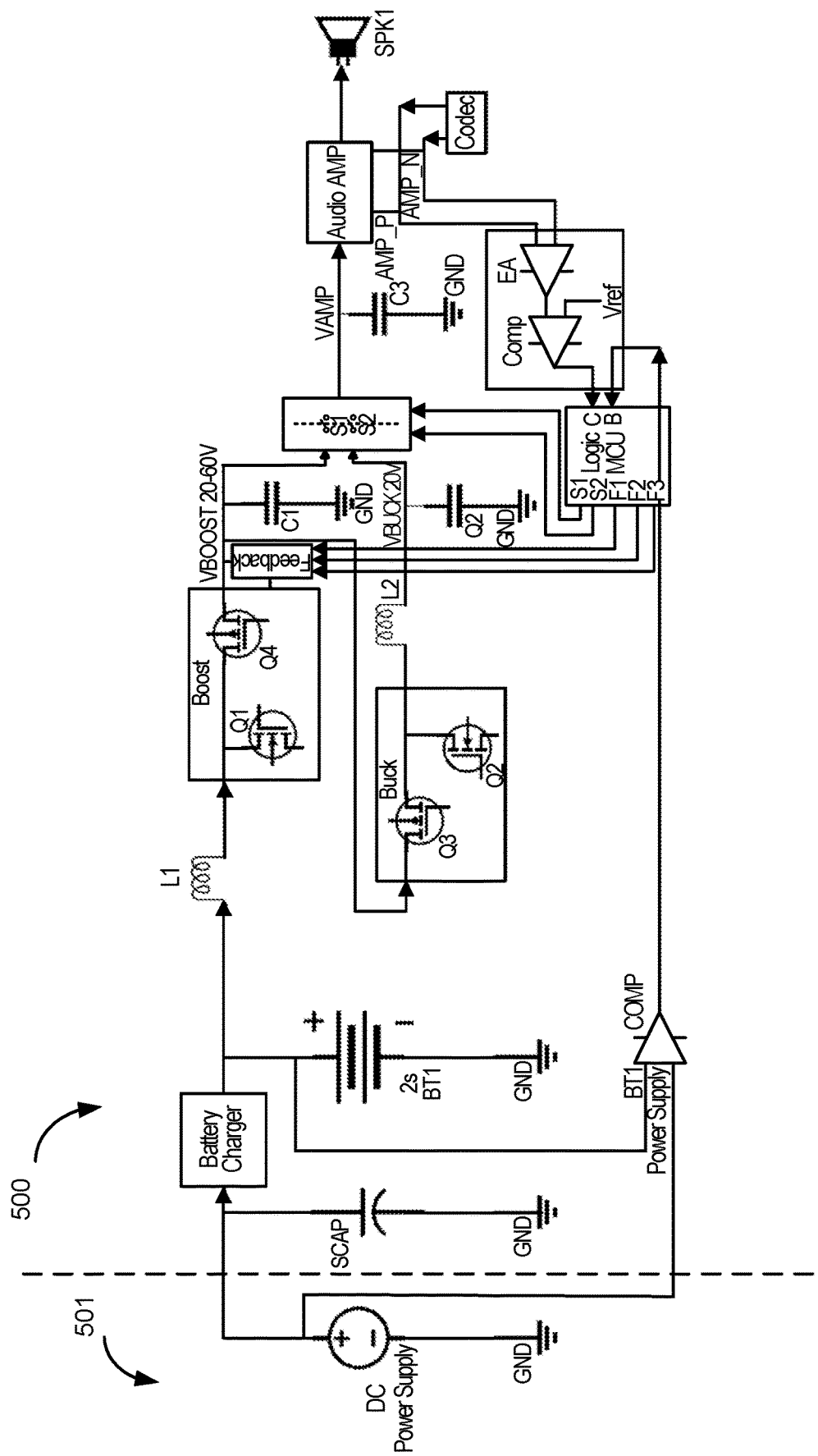
FIG. 5 illustrates an example of components of a portable device, according to embodiments of the present disclosure.

FIG. 5 illustrates an example of components of a portable device 500, according to embodiments of the present disclosure. The portable device 500 is an example of the portable device 110 of FIG. 1. As illustrated, the portable device may, but need not, be electrically coupled with an external power source 501, such as a DC power supply (e.g., 15V).

Describing the components of the portable device 500 as illustrated from left to right in FIG. 5, the components include a super capacitor (Scap) that is connected to a battery charger that in turn is connected to an internal power source. The internal power source can be two DC batteries in series. The internal power source is connected to an inductor L1 that, in turn, is connected to a boost converter. The output of the boost connector is connected to a feedback network that includes a voltage divider network and switches to activate one or more of the voltage dividers from a microcontroller (shown as logic MCU). The output of the feedback network is connected to a capacitor C1 and to a buck converter. The voltage across the capacitor C1 represents the output voltage of a first stage (e.g., $V_{boost}$). The capacitor C1 is connected to a switch S1. By closing the switch S1 (e.g., S1 is in an on state), the output of the first stage (e.g., at the voltage level $V_{boost}$) is connected to an input of an audio amplifier. That input is also connected to a capacitor C3. The output of the buck converter is connected to an inductor L2 that, in turn, is connected to a capacitor C2. The voltage across the capacitor C2 represents the output voltage of a second stage (e.g., $V_{buck}$). The capacitor C2 is connected to a switch S2. By closing the switch S2 (e.g., S2 is in an on state), the output of the second stage (e.g., at the voltage level $V_{buck}$) is connected to the input of the audio amplifier. The audio amplifier is connected to a speaker SPK1.

In addition, the portable device includes an audio mode detector circuit and, optionally, a power source detector circuit. The audio mode detector circuit includes an error amplifier EA and a comparator COMP. In particular, an audio signal can correspond to monophonic or stereophonic audio and can include a positive audio signal and a negative audio signal in a balanced audio configuration to cancel noise in the transmission medium. In this case, the audio mode can be determined by determining a differential error of the positive audio signal and the negative audio signal, determining a difference between the differential error and a reference signal, and generating an output that indicates an audio mode based on the difference. In particular, the envelopes of the positive and negative audio signals are output over the transmission medium (e.g., wires) from a codec device of the portable device 500 and are show as AMP_P and AMP_N. The error amplifier EA receives the envelopes, determines the peak amplitudes in each, and selects the positive or negative signal that has the greatest peak amplitude. The greatest peak amplitude (or the respective audio signal) is passed from the error amplifier EA to the comparator COMP. As a second input, the comparator COMP receives a peak amplitude of a reference audio signal (or the reference audio signal itself), compares the two peak amplitudes, and determines their difference. The comparator COMP also compares the difference to a loudness threshold. If the difference is greater than the loudness threshold, the comparator COMP generates and sends a logic output "C" indicating a high dynamic range audio mode. Otherwise, the comparator COMP sets the logic output "C" to indicate a low dynamic range audio mode.

The power source detector circuit includes another comparator COMP. This comparator COMP receives two inputs: the first one indicating the voltage level BT1 as the output of the internal power source, and the second one indicating the voltage level "DC Power Supply" as the output of the external power source 501. The comparator COMP compares the two inputs to generate and send a logic output "B" indicating whether the external power source 501 is electrically coupled with the portable device 500. For instance, if the difference between the two inputs is less than a predefined threshold or zero, the logic output "B" is set to indicate that the external power source 501 is electrically coupled; otherwise, the logic output "B" is set to indicate that the external power source 501 is not electrically coupled.

Figure 6:
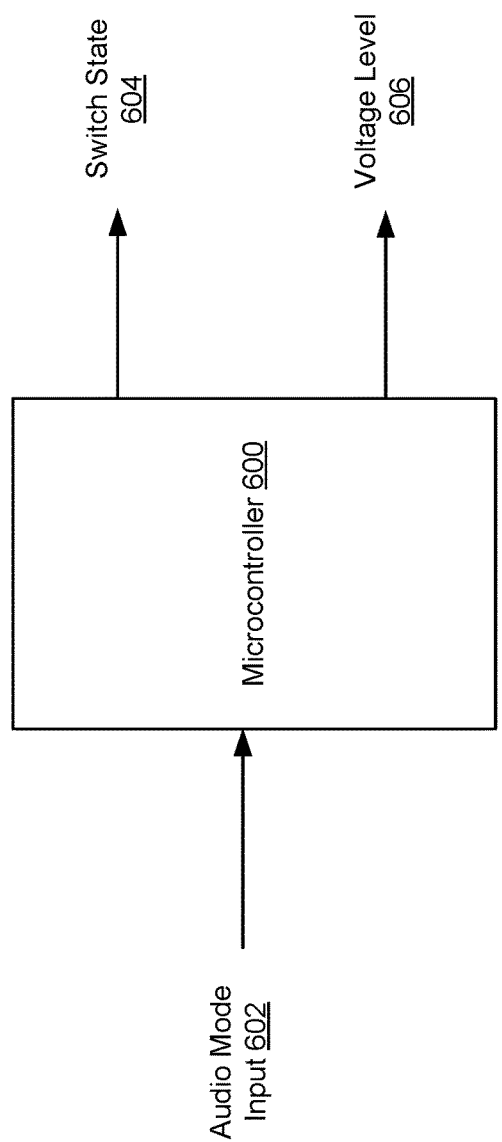
FIG. 6 illustrates an example of input to and output from a microcontroller of a portable device, according to embodiments of the present disclosure.

FIG. 6 illustrates an example of input to and output from a microcontroller 600 of a portable device, according to embodiments of the present disclosure. The portable device includes an internal power source but does not rely on an external power source to recharge the internal power source or to provide additional electrical power. Hence, the input to the portable device does not include an indication of whether an external power source is electrically coupled or not.

As illustrated, the microcontroller 600 receives an audio mode input 602 indicating the audio mode of the portable device. Given the input 602 and stored logic defining the power configuration for the audio mode, the microcontroller 600 generates an output that includes a switch state 604 and a voltage level 606. The switch state 604 indicates one or more states of one or more switches within a switch network of a multi-stage power converter of the portable device (e.g., whether each of the switch should be in a close or open position). The voltage level 606 indicates one or more voltage levels of one or more outputs corresponding to stages of the multi-stage power converter.

To illustrate, and referring back to the portable device 500 of FIG. 5 that includes a two-stage power converter (one having a first stage that involves a boost converter and a second stage that involves the boost converter and the buck converter), the audio mode input 602 is a logic input "C," where a value of "1" indicates a high dynamic range audio mode and a value of "0" indicates a low dynamic range audio mode. The switch state 604 includes a logic output "S" for each of the first switch S1 and the second switch S2, where a value of "1" indicates an "on" switch (e.g., in the closed position) and a value of "0" indicates an "off" switch (e.g., in the open position). The voltage level 606 indicates the target voltage for Vboost (e.g., the output voltage of the first stage). That voltage level can be set to one of two values: 20V or 60V through two different voltage dividers in a voltage divider network. The first voltage divider supports the 20V output and the second voltage divider supports the 60V output. Accordingly, the voltage level 606 includes a logic output "F" for each of the first voltage divider and the second voltage divider, where a value of "1" indicates that the respective voltage divider should be active and a value of "0" indicates that it should be de-active. Given the different logic states of "C," "S," and "F," the below table can be defined and stored as part of the logic of the microcontroller.

TABLE 1

| Input | Output | | | |
|---|---|---|---|---|
| C | S1 | S2 | F1 | F2 |
| 0 | 1 | 0 | 1 | 0 |
| 1 | 0 | 1 | 0 | 1 |

Per Table 1, when the audio mode input 602 indicates a low dynamic range audio mode (e.g., "C" is "0"), switch S1 is closed while switch S2 is open, and the first voltage divider is active while the second voltage divider is de-active. In this way, $V_{boost}$ is the output of the multi-stage power converter and is set to 20V. When the audio mode input 602 indicates a high dynamic range audio mode (e.g., "C" is "1"), switch S1 is open while switch S2 is closed, and the first voltage divider is de-active while the second voltage divider is active. In this way, $V_{buck}$ is the output of the multi-stage power converter and is set to 20V while $V_{boost}$ is set to 60V.

Figure 7:
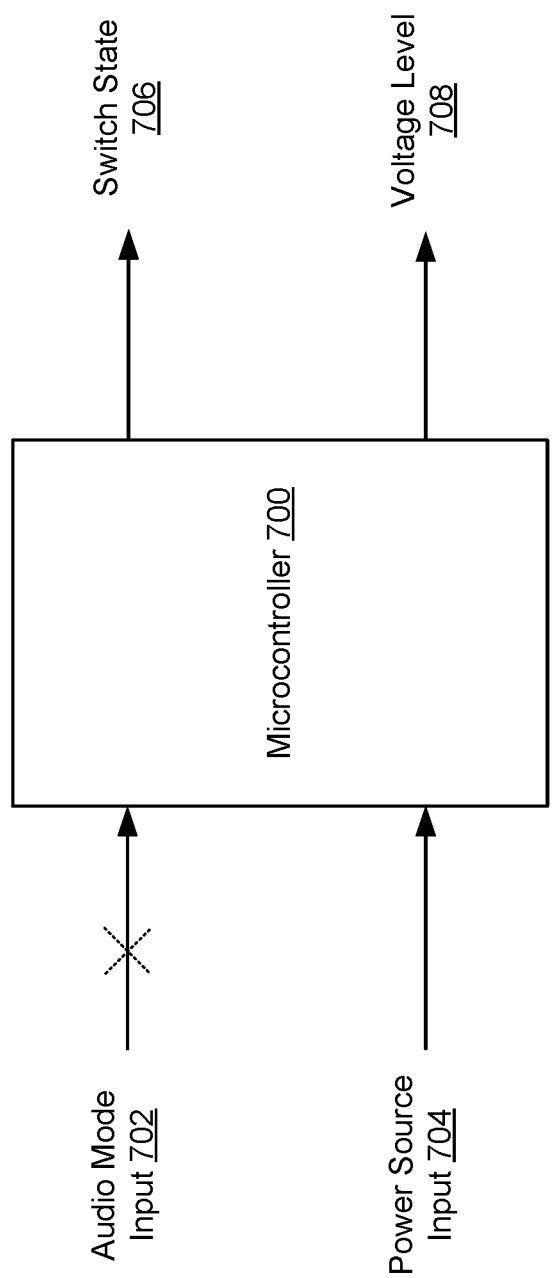
FIG. 7 illustrates another example of input to and output from a microcontroller of a portable device, according to embodiments of the present disclosure.

FIG. 7 illustrates another example of input to and output from a microcontroller 700 of a portable device, according to embodiments of the present disclosure 700. The portable device includes an internal power source and can be electrically coupled with an external power source to recharge the internal power source or to receive additional electrical power. Unlike the input to microcontroller 600 of FIG. 6, here the input to the portable device includes an indication of whether an external power source is electrically coupled or not.

As illustrated, the microcontroller 700 receives an audio mode input 702 indicating the audio mode of the portable device and a power source mode input 704 indicating whether the external power source is electrically coupled or not. Given the inputs 702 and 704 and stored logic defining the power configuration for the audio mode and the availability of the external power source, the microcontroller 700 generates an output that includes a switch state 706 and a voltage level 708. The switch state 706 indicates one or more states of one or more switches within a switch network of a multi-stage power converter of the portable device (e.g., whether each of the switch should be in a close or open position). The voltage level 708 indicates one or more voltage levels of one or more outputs corresponding to stages of the multi-stage power converter.

To illustrate, and referring back to the portable device 500 of FIG. 5 that includes a two-stage power converter (one having a first stage that involves a boost converter and a second stage that involves the boost converter and the buck converter), the audio mode input 702 is a logic input "C," where a value of "1" indicates a high dynamic range audio mode and a value of "0" indicates a low dynamic range audio mode. The external power input 704 is a logic input "B," where a value of "1" indicates that the external power source is electrically coupled with the portable device and a value of "0" indicates otherwise. The switch state 706 includes a logic output "S" for each of the first switch S1 and the second switch S2, where a value of "1" indicates an "on" switch (e.g., in the closed position) and a value of "0" indicates an "off" switch (e.g., in the open position). The voltage level 708 indicates the target voltage for Vboost (e.g., the output voltage of the first stage). That voltage level can be set to one of three values: 20V, 35V, or 60V through three different voltage dividers in a voltage divider network. The first voltage divider supports the 20V output, the second voltage divider supports the 60V output, and the third voltage divider supports the 35V output. Accordingly, the voltage level 708 includes a logic output "F" for each of the first, second, and third voltage divider, where a value of "1" indicates that the respective voltage divider should be active and a value of "0" indicates that it should be de-active. Given the different logic states of "B," "C," "S," and "F," the below table can be defined and stored as part of the logic of the microcontroller.

TABLE 2

| Input | | Output | | | | |
|---|---|---|---|---|---|---|
| B | C | S1 | S2 | F1 | F2 | F3 |
| 0 | 0 | 1 | 0 | 1 | 0 | 0 |
| 0 | 1 | 0 | 1 | 0 | 1 | 0 |
| 1 | X | 1 | 0 | 0 | 0 | 1 |

Per Table 2, when the external power input 704 indicates that the external power source is unavailable (e.g., "B" is "0") and when the audio mode input 702 indicates a low dynamic range audio mode (e.g., "C" is "0"), switch S1 is closed while switch S2 is open, and the first voltage divider is active while the second and third voltage dividers are de-active. In this way, $V_{boost}$ is the output of the multi-stage power converter and is set to 20V. When the external power input 704 indicates that the external power source is unavailable (e.g., "B" is "0") and when the audio mode input 602 indicates a high dynamic range audio mode (e.g., "C" is "1"), switch S1 is open while switch S2 is closed, and the first and third voltage dividers are de-active while the second voltage divider is active. In this way, $V_{buck}$ is the output of the multi-stage power converter and is set to 20V while $V_{boost}$ is set to 60V. When the external power input 704 indicates that the external power source is available (e.g., "B" is "1"), switch S1 is closed while switch S2 is open, and the first and second voltage dividers are de-active while the third voltage divider is active. In this way, $V_{boost}$ is the output of the multi-stage power converter and is set to 35V. In this case, the voltage level is set independently of whether the audio mode is low or high dynamic audio mode range (e.g., independently of "C" as shown with an "X" in Table 2—a "do not care" and with an "X" in FIG. 7).

Referring to the example portable device 500 of FIG. 5 and the example microcontroller 700 of FIG. 7, a two-stage power converter with analog pass through multiplexer switch is implemented. The implementation provides a boost converter and a buck converter that are active at different audio modes. An analog audio tracking mechanism is possible based on the analog audio waveform from the codec. Based on tunable threshold, the audio amplitude is converted to logic high/low by the error amplifier EA and the comparator COMP. This logic output "C" is provided to the microcontroller 700.

In a default use case of the low dynamic range audio mode, such as in vocal audio reproduction, the boost convertor is active (multiplexer switch S1 is active). Given a two-series battery usage with a typical 7.5V and a max 15 W speaker draw, the boost converter is configured to output 20V (based on feedback configuration F1). If a 0.375 A current draw is demanded by the audio subsystem, resulting in a 7.5 W power draw, the battery needs to 1.2 A current, resulting in a 240 mV droop.

When the high dynamic range audio mode is detected, and the speakers demand 15 W power for 500 ms, the buck converter becomes active (multiplexer switch S2 active), the voltage divider network is configured to F2 (e.g., 60V output). By increasing the voltage on the capacitor C1 by three times, the total energy stored in increased nine times ($E=0.5CV^2$). The boost and buck converters are in series in this audio mode. The buck converter still maintains at 20V output resulting in 0.75 A current draw. Assuming C1=500 g, the buck converter can support a 15 W peak for 50 ms. On the battery side, a current limit of 1.2 A takes 46 ms to replenish C1 to 60V max capacity assuming 30V voltage drop allowed on the capacitor C1.

When compared to a conventional single stage boost only system, this dual stage implementation along with smart power path switching provides nine times energy buffer for instantaneous peaks of high dynamic audio current draw. It also reduces its direct effect on battery loading and thereby reduces occurrences of system brown-out.

When the external power source 501 is electrically coupled with the portable device 500, the external power source 501 provides 15 W of charging at 15V. In this external power mode, the DC charger voltage is compared to the battery voltage and the logic output "B" is derived by the second comparator COMP. When "B" becomes active, the microcontroller 700 switches the feedback configuration to F3 and the boost voltage increases to 35V (multiplexer switch stays at S1). This increased voltage gives louder audio and during the high dynamic range audio mode, the buck converter need not to be enabled. The charger supplements the battery current whenever the boost output voltage starts to droop.

Figure 8:
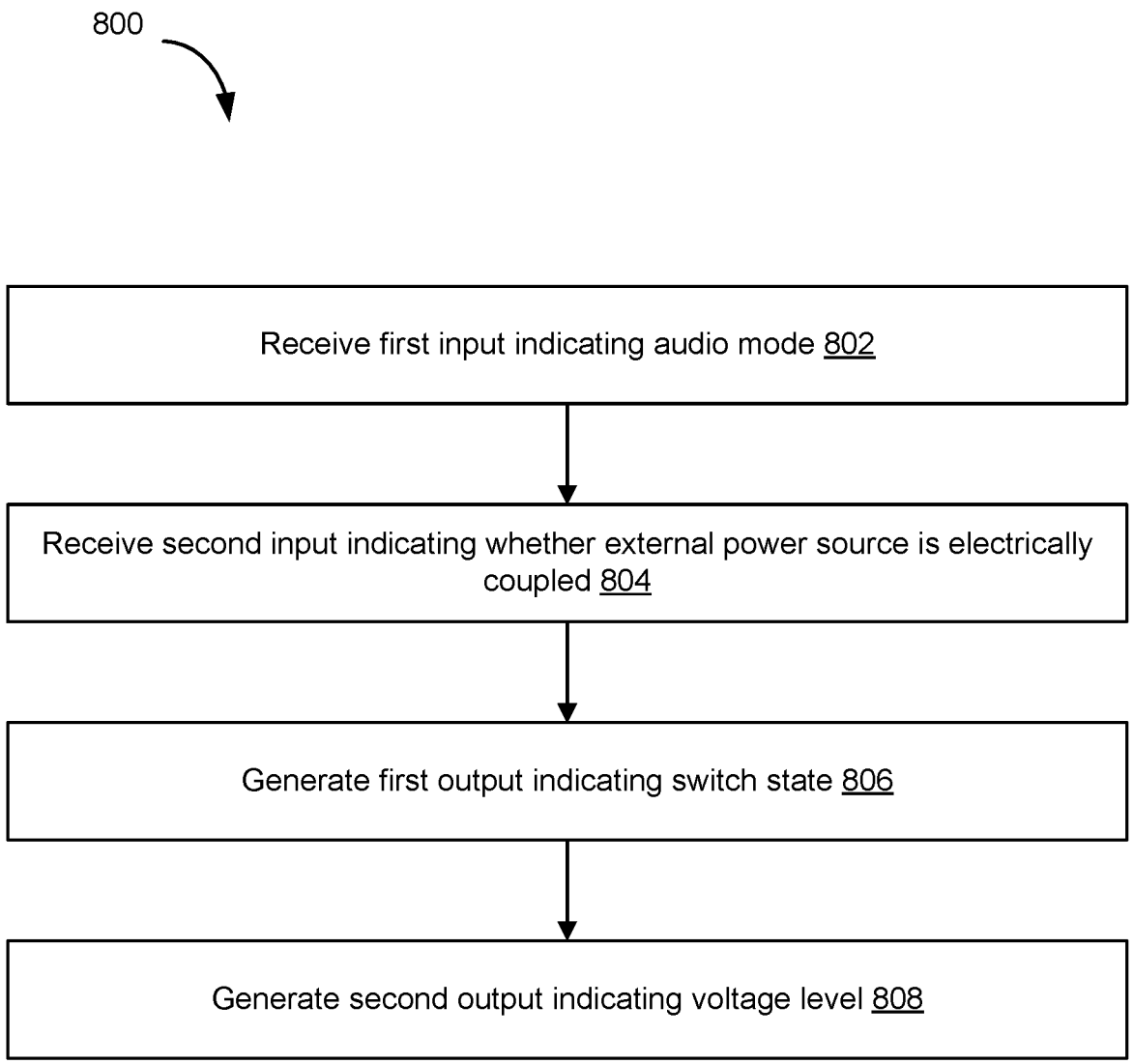
FIG. 8 illustrates an example of a flow for using a microcontroller of a portable device to set a power configuration of the portable device, according to embodiments of the present disclosure.

FIG. 8 illustrates an example of a flow 800 for using a microcontroller of a portable device to set a power configuration of the portable device, according to embodiments of the present disclosure. The microcontroller can be any of the microcontrollers described in connection with FIGS. 1-7. Instructions for performing the operations of the flow 800 can be stored as computer-readable instructions on non-transitory computer-readable media of the microcontroller. As stored, the instructions represent programmable modules that include code executable by a processor of the microcontroller. The execution of such instructions configures the microcontroller to perform the specific operations shown in FIG. 8 and described herein. Each programmable module in combination with the processor represents a means for performing a respective operation(s). While the operations are illustrated in a particular order, it should be understood that no particular order is necessary and that one or more operations may be omitted, skipped, and/or reordered.

In an example, the flow 800 starts at operation 802, where the microcontroller receives a first input indicating an audio mode. For instance, the first input is received as a logic output from an audio mode detector and represent and an audio mode input. Examples of audio modes include a low dynamic range audio mode and a high dynamic range audio mode. The low dynamic range audio mode can be the default mode, whereas the high dynamic range audio mode can be applicable when the audio signal is too loud or includes a bass frequency.

At operation 804, the microcontroller receives a second input indicating whether an external power source is electrically coupled with the portable device. This operation is optional, depending on whether the portable device is configured to use an external power source. In an example, the second input is received as a logic output from a power source detector and represent and a power source input.

At operation 806, the microcontroller generates a first output indicating a switch state based on the first input and, optionally, the second input. In an example, the microcontroller stores logic that, given the input(s), identifies the switch state. For instance, and referring to Table 1 and Table 2, the first output indicates whether each of the switches should be open or closed, such that one or more stages of a multi-stage power controller of the portable device are active and remaining one or more stages of the multi-stage power controller are de-active. The first output can be sent to a switch network that includes the switches, thereby causing the switches to be open and closed as applicable.

At operation 808, the microcontroller generates a second output indicating a voltage level based on the first input and, optionally, the second input. In an example, the microcontroller stores logic that, given the input(s), identifies the voltage level. Given the switch state, the voltage level corresponds to one or more outputs of stages of the multi-stage power converter. For instance, and referring to Table 1 and Table 2, the second output indicates the voltage level of $V_{boost}$ and/or $V_{buck}$. The second output can be sent to a voltage divider network that includes voltage dividers, thereby causing the relevant voltage divider(s) to be active.

Figure 9:
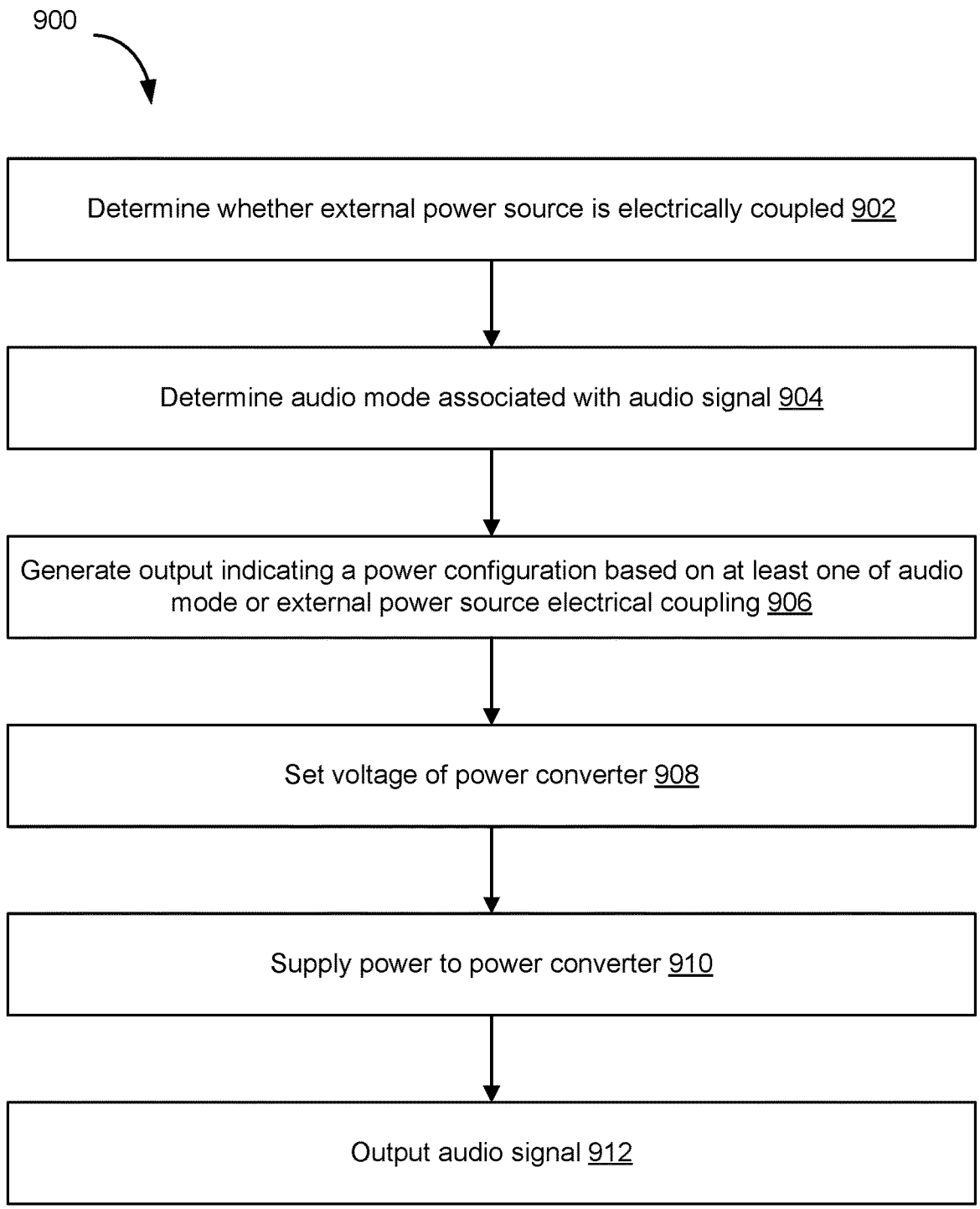
FIG. 9 illustrates an example of a flow for using a portable device to set a power configuration of the portable device, according to embodiments of the present disclosure.

FIG. 9 illustrates an example of a flow 900 for using a portable device to set a power configuration of the portable device, according to embodiments of the present disclosure. The portable device can be any of the portable devices described in connection with FIGS. 1-7. Some of the operations of the flow 900 can be implemented via hardware. Instructions for performing other operations of the flow 900 can be stored as computer-readable instructions on non-transitory computer-readable media of the portable device. As stored, the instructions represent programmable modules that include code executable by a processor of the portable device. The execution of such instructions configures the portable device to perform the specific operations. Each programmable module in combination with the processor represents a means for performing a respective operation(s). While the operations are illustrated in a particular order, it should be understood that no particular order is necessary and that one or more operations may be omitted, skipped, and/or reordered.

In an example, the flow 900 starts at operation 902, where the portable device determines whether an external power source is electrically coupled with the portable device. In an example, the portable device includes a power source detector that generates a logic output indicating whether the external power source is electrically coupled or not. For instance, the power source detector includes a comparator that receives a first input corresponding to the output voltage of an internal power source of the portable device and a second input corresponding to the output voltage of the external power source. The comparator compares the two inputs and if the difference between the two voltages is less than a threshold, the logic output is set to indicate that the external power source is electrically coupled. Otherwise, the logic output is set to indicate that the external power source is not electrically coupled.

At operation 904, the portable device determines an audio mode associated with an audio signal that is to be output by the portable device. In an example, the portable device includes an audio mode detector that generates a logic output indicating the audio mode. For instance, audio mode detector processes one or more audio signals from a codec device of the portable device. The processing can involve determining the greatest peak amplitude and comparing it to a peak amplitude of a reference signal. If the difference between the two peak amplitudes is greater than a loudness level, such as a predefined loudness threshold, the audio mode detector detects that the audio signal is too loud. Further, the processing can involve an analysis of the frequency of the audio signal(s). If the frequency is less than a predefined frequency, such as 250 Hz, the audio mode detector that the audio signal includes a bass frequency (e.g., the frequency is within a range of bass frequencies). A logic output is generated based on the processing to indicate whether the audio mode is associated with a loud audio signal and/or an audio signal that includes a bass frequency.

At operation 906, the portable device generates an output indicating a power configuration based on at least of the audio mode or the electrical coupling of the external power source. For example, a microcontroller of the portable device receives the logic outputs and stores logic to generate the power configuration. The power configuration can indicate one or voltage levels for stages of a multi-stage power converter of the portable device and one or more switch states for the multi-stage power converter. The logic can specify the voltage level(s) and switch state(s) for each audio mode and/or for whether the external power source is coupled or not.

At operation 908, the portable device sets the voltage of the multi-stage power converter. In an example, the switches of the multi-stage power converter are closed and open depending on the switch stages. In addition, voltage dividers are activated and deactivated to output the target voltage level.

At operation 910, the portable device supplies power to the multi-stage power converter. For example, upon configuring the switches and voltage dividers, the multi-stage power converter draws power from the internal power source and/or external power source as applicable.

At operation 912, the portable device outputs the audio signal. For example, the audio signal is amplified by an audio amplifier. An input of the audio amplifier is connected to the active output of the multi-stage power converter. An output of the audio amplifier is connected to a speaker of the portable device. The speaker presents the audio signal as an audio output from the portable device.

Figure 10:
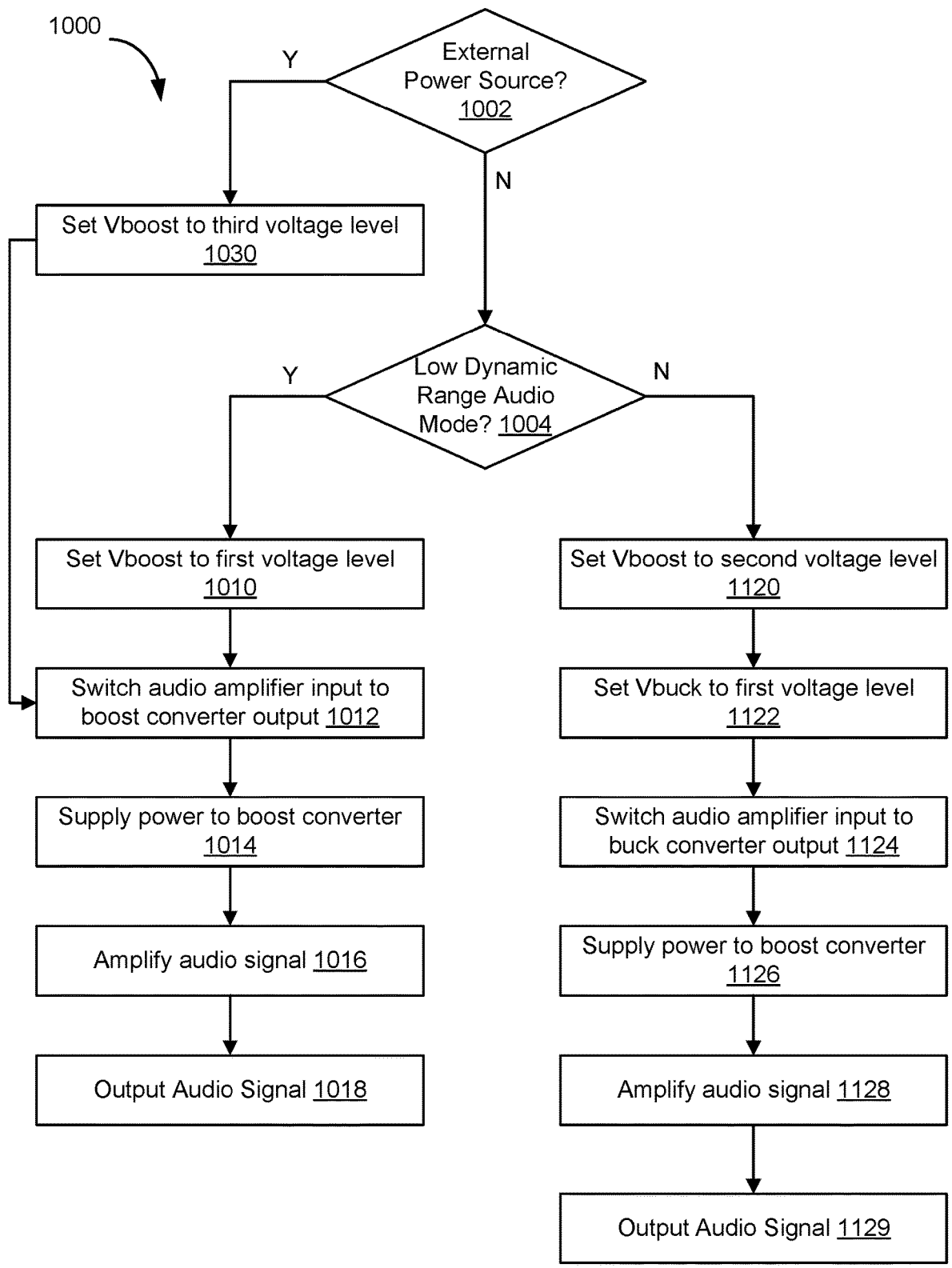
FIG. 10 illustrates another example of a flow for using a portable device to set a power configuration of the portable device, according to embodiments of the present disclosure.

FIG. 10 illustrates another example of a flow 1000 for using a portable device to set a power configuration of the portable device, according to embodiments of the present disclosure. Here, the portable device uses a two-stage power converter that includes a boost converter and a buck converter, similarly to the portable device 500 of FIG. 5. Some of the operations of the flow 1000 can be implemented via hardware. Instructions for performing other operations of the flow 1000 can be stored as computer-readable instructions on non-transitory computer-readable media of the portable device. As stored, the instructions represent programmable modules that include code executable by a processor of the portable device. The execution of such instructions configures the portable device to perform the specific operations. Each programmable module in combination with the processor represents a means for performing a respective operation(s). While the operations are illustrated in a particular order, it should be understood that no particular order is necessary and that one or more operations may be omitted, skipped, and/or reordered.

In an example, the flow 1000 starts at operation 1002, where the portable device detects whether an external power source is electrically coupled with the portable device. For instance, depending on the difference between voltages of an internal power source and the external power source, if any, a power source detector performs the detection. If an external power source is not electrically coupled, operation 1004 follows operation 1002. Otherwise, operation 1030 follows operation 1002.

At operation 1004, the portable device determines whether an audio signal to be output by the portable device is associated with a low dynamic range audio mode or a high dynamic range audio mode. For instance, depending on the amplitude and/or the frequency of the audio signal, an audio mode detector performs the detection. If the audio signal is associated with the low dynamic range audio mode, operation 1010 follows operation 1004. Otherwise, operation 1020 follows operation 1004.

At operation 1010, the portable device sets the voltage $V_{boost}$ at the output of the boost converter to a first voltage level. Here, there is no external power source coupling and the audio mode is a low dynamic range audio mode. In an example, a microcontroller of the portable device receives an input indicating the low dynamic range audio mode and the absence of the electrical coupling of the external power source and generates an output that specifies the first voltage level at the output (e.g., 20V). A voltage divider network of the portable device receives the output and switches on a divider network that provides the first voltage level.

At operation 1012, the portable device switches an input of an audio amplifier of the portable device to the output of the boost converter. For instance, the microcontroller also outputs a switch state indicating to a switch network of the portable device to close a switch to the output of the boost converter and open a switch to the output of the buck converter.

At operation 1014, the portable device supplies power to the boost converter. For instance, the power is supplied from the internal power source.

At operation 1016, the portable device amplifies the audio signal. For instance, the input of the audio amplifier is switched on to the output of the boost converter, thereby amplifying the audio signal according to the first voltage level.

At operation 1018, the portable device outputs the audio signal. For instance, an input of the speaker of the portable device is connected to the output of the audio amplifier. The amplified audio is presented by the speaker as an audio output.

At operation 1020, the portable device sets the voltage $V_{boost}$ at the output of the boost converter to a second voltage level. Here, there is no external power source coupling and the audio mode is a high dynamic range audio mode. In an example, the microcontroller receives an input indicating the high dynamic range audio mode and the absence of the electrical coupling of the external power source and generates an output that specifies the second voltage level at the output at the boost converter (e.g., 60V). The voltage divider network receives the output and switches on a divider network that provides the second voltage level.

At operation 1022, the portable device sets the voltage $V_{buck}$ at the output of the buck converter to the first voltage level. For instance, the microcontroller's output also specifies the first voltage level at the output of the buck converter (e.g., 20V).

At operation 1024, the portable device switches the input of the audio amplifier to the output of the buck converter. For instance, the microcontroller also outputs a switch state indicating to the switch network to open the switch to the output of the boost converter and close the switch to the output of the buck converter.

At operation 1026, the portable device supplies power to the boost converter. For instance, the power is supplied from the internal power source.

At operation 1028, the portable device amplifies the audio signal. For instance, the input of the audio amplifier is switched on to the output of the buck converter, thereby amplifying the audio signal according to the first voltage level at the current level depending on the power draw from the boost converter at the second voltage level.

At operation 1029, the portable device outputs the audio signal. For instance, the amplified audio is presented by the speaker as an audio output.

At operation 1030, t the portable device sets the voltage $V_{boost}$ at the output of the boost converter to a third voltage level. Here, there is external power source coupling and the audio mode can be either a low dynamic range audio mode or a high dynamic range audio mode. In an example, the microcontroller receives an input indicating the presence of the electrical coupling of the external power source and generates an output that specifies the third voltage level at the output at the boost converter (e.g., 35V). The voltage divider network receives the output and switches on a divider network that provides the second voltage level. Operation 1012 follows operation 1030 to close the proper switch to the audio amplifier.

Figure 11:
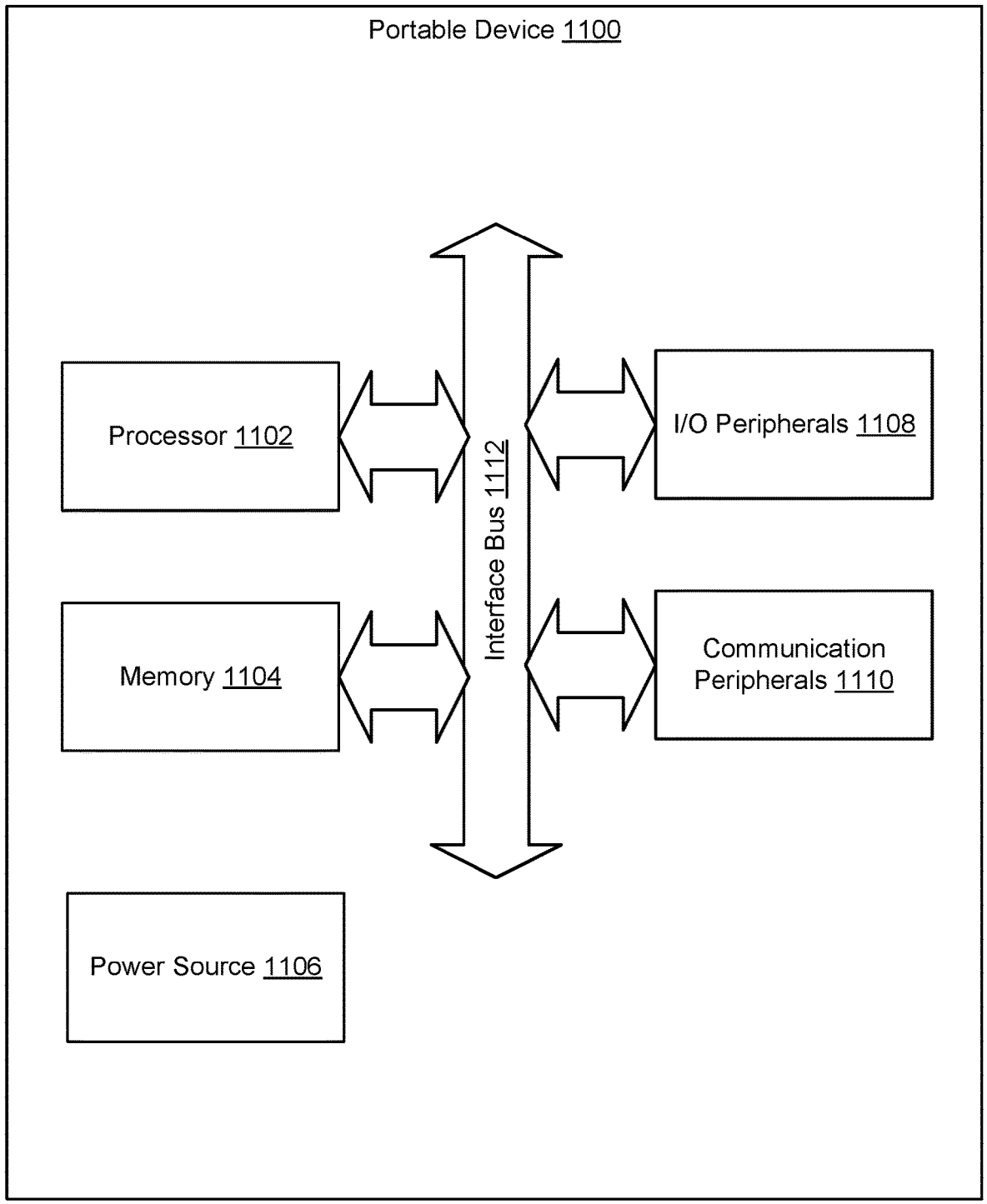
FIG. 11 illustrates an example of components of a portable device, according to embodiments of the present disclosure.

FIG. 11 illustrates examples of components of a portable device 1100 according to certain embodiments. The portable device 1100 is an example of the portable device described in connection with the above figures.

In an example, he portable device 1100 includes at least a processor 1102, a memory 1104, a power source 1106, input/output peripherals (I/O) 1108, communication peripherals 1110, and an interface bus 1112. The interface bus 1112 is configured to communicate, transmit, and transfer data, controls, and commands among the various components of the portable device 1100. The memory 1104 included computer-readable storage media, such as RAM, ROM, electrically erasable programmable read-only memory (EEPROM), hard drives, CD-ROMs, optical storage devices, magnetic storage devices, electronic non-volatile computer storage, for example Flash® memory, and other tangible storage media. Any of such computer readable storage media can be configured to store instructions or program codes embodying aspects of the disclosure. The memory 1104 also included computer readable signal media. A computer readable signal medium includes a propagated data signal with computer readable program code embodied therein. Such a propagated signal takes any of a variety of forms including, but not limited to, electromagnetic, optical, or any combination thereof. A computer readable signal medium includes any computer readable medium that is not a computer readable storage medium and that can communicate, propagate, or transport a program for use in connection with the portable device 1100.

The power source 1106 includes an internal power source to the portable device, such as a set of batteries in series. The I/O peripherals 1108 include user interfaces, such as a keyboard, screen (e.g., a touch screen), microphone, audio processing circuitry (e.g. speaker, power converter, audio amplifier, etc. as described in connection with the above figures), other input/output devices, and computing components, such as graphical processing units, serial ports, parallel ports, universal serial buses, and other input/output peripherals. The I/O peripherals 1108 are connected to the processor 1102 through any of the ports coupled to the interface bus 1112.

The communication peripherals 1110 are configured to facilitate communication between the portable device 1100 and other computing devices over a communications network and include, for example, a network interface controller, modem, wireless and wired interface cards, antenna, and other communication peripherals.

While the present subject matter has been described in detail with respect to specific embodiments thereof, it will be appreciated that those skilled in the art, upon attaining an understanding of the foregoing may readily produce alterations to, variations of, and equivalents to such embodiments. Accordingly, it should be understood that the present disclosure has been presented for purposes of example rather than limitation, and does not preclude inclusion of such modifications, variations, and/or additions to the present subject matter as would be readily apparent to one of ordinary skill in the art. Indeed, the methods and systems described herein may be embodied in a variety of other forms; furthermore, various omissions, substitutions and changes in the form of the methods and systems described herein may be made without departing from the spirit of the present disclosure. The accompanying claims and their equivalents are intended to cover such forms or modifications as would fall within the scope and spirit of the present disclosure.

Unless specifically stated otherwise, it is appreciated that throughout this specification discussions utilizing terms such as "processing," "computing," "calculating," "determining," and "identifying" or the like refer to actions or processes of a computing device, such as one or more computers or a similar electronic computing device or devices, that manipulate or transform data represented as physical electronic or magnetic quantities within memories, registers, or other information storage devices, transmission devices, or display devices of the computing platform.

The system or systems discussed herein are not limited to any particular hardware architecture or configuration. A computing device can include any suitable arrangement of components that provide a result conditioned on one or more inputs. Suitable computing devices include multipurpose microprocessor-based computer systems accessing stored software that programs or configures the portable device from a general-purpose computing apparatus to a specialized computing apparatus implementing one or more embodiments of the present subject matter. Any suitable programming, scripting, or other type of language or combinations of languages may be used to implement the teachings contained herein in software to be used in programming or configuring a computing device.

Embodiments of the methods disclosed herein may be performed in the operation of such computing devices. The order of the blocks presented in the examples above can be varied—for example, blocks can be re-ordered, combined, and/or broken into sub-blocks. Certain blocks or processes can be performed in parallel.

Conditional language used herein, such as, among others, "can," "could," "might," "may," "e.g.," and the like, unless specifically stated otherwise, or otherwise understood within the context as used, is generally intended to convey that certain examples include, while other examples do not include, certain features, elements, and/or steps. Thus, such conditional language is not generally intended to imply that features, elements and/or steps are in any way required for one or more examples or that one or more examples necessarily include logic for deciding, with or without author input or prompting, whether these features, elements and/or steps are included or are to be performed in any particular example.

The terms "comprising," "including," "having," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list. The use of "adapted to" or "configured to" herein is meant as open and inclusive language that does not foreclose devices adapted to or configured to perform additional tasks or steps. Additionally, the use of "based on" is meant to be open and inclusive, in that a process, step, calculation, or other action "based on" one or more recited conditions or values may, in practice, be based on additional conditions or values beyond those recited. Similarly, the use of "based at least in part on" is meant to be open and inclusive, in that a process, step, calculation, or other action "based at least in part on" one or more recited conditions or values may, in practice, be based on additional conditions or values beyond those recited. Headings, lists, and numbering included herein are for ease of explanation only and are not meant to be limiting.

The various features and processes described above may be used independently of one another, or may be combined in various ways. All possible combinations and sub-combinations are intended to fall within the scope of the present disclosure. In addition, certain method or process blocks may be omitted in some implementations. The methods and processes described herein are also not limited to any particular sequence, and the blocks or states relating thereto can be performed in other sequences that are appropriate. For example, described blocks or states may be performed in an order other than that specifically disclosed, or multiple blocks or states may be combined in a single block or state. The example blocks or states may be performed in serial, in parallel, or in some other manner. Blocks or states may be added to or removed from the disclosed examples. Similarly, the example systems and components described herein may be configured differently than described. For example, elements may be added to, removed from, or rearranged compared to the disclosed examples.

What is claimed is:

1. A method implemented by a portable device, the method comprising:
   determining that an audio signal to be output by the portable device has at least one of: (i) an amplitude that is less than a loudness threshold, or (ii) a frequency that is greater than a frequency threshold;
   setting a voltage at a first stage of a multi-stage power converter of the portable device to a voltage level based at least in part on the amplitude or the frequency;
   amplifying, via an audio amplifier, the audio signal by at least coupling the audio amplifier with the first stage, decoupling the audio amplifier from a second stage of the multi-stage power converter, and supplying, to the multi-stage power converter, an amount of power based at least in part on the voltage level; and
   outputting, by a speaker, the audio signal based at least in part on the amplifying.

2. The method of claim 1, further comprising:
   determining that the audio signal is associated with an audio mode based on the at least one of the amplitude being less than the loudness threshold or the frequency being greater than the frequency threshold; and
   outputting the voltage to the audio amplifier based at least in part on the audio mode, wherein the audio signal is amplified by the audio amplifier.

3. The method of claim 2, further comprising:
   determining that external power from an external power source is unavailable to the portable device, wherein outputting the voltage comprises switching an input voltage of the audio amplifier to the voltage based at least in part on the external power source being unavailable and the audio mode.

4. The method of claim 1, further comprising:
   determining that the audio signal is associated with an audio mode based on the at least one of the amplitude being less than the loudness threshold or the frequency being greater than the frequency threshold;
   outputting the voltage from the first stage of the multi-stage power converter to the second stage of the multi-stage power converter; and
   outputting a second voltage to the audio amplifier of the portable device based at least in part on the audio mode.

5. The method of claim 4, further comprising:
   determining that external power from an external power source is unavailable to the portable device, wherein outputting the second voltage comprises switching an input voltage of the audio amplifier to the second voltage based at least in part on the external power source being unavailable and the audio mode.

6. The method of claim 1, further comprising:
   determining that a second power source external to the portable device is electrically coupled with the portable device;
   setting the voltage to a second voltage level based at least in part on the second power source being electrically coupled; and
   outputting the voltage at the second voltage level to the audio amplifier of the portable device.

7. The method of claim 6, further comprising:
   amplifying, by the audio amplifier, a second audio signal based at least in part on the second voltage level; and
   outputting, by the speaker of the portable device, the second audio signal.

8. The method of claim 1, wherein setting the voltage comprises:
   determining that the audio signal is associated with an audio mode based on the at least one of the amplitude being less than the loudness threshold or the frequency being greater than the frequency threshold;

receiving, by a processor of the portable device, a first input indicating the audio mode; and providing, by the processor, a first output and a second output based at least in part on the first input, wherein the first output indicates whether an output of the multi-stage power converter is to be switched to a first output of the first stage of the multi-stage power converter or to a second output of the second stage of the multi-stage power converter, and wherein the second output indicates the voltage level for the voltage at the first output.

9. The method of claim 8, wherein setting the voltage further comprises:

receiving, by the processor, a second input indicating whether an external power source is electrically coupled with the portable device, and wherein, upon the second input indicating that the external power source is electrically coupled:

the first output indicates that the output is to be switched to the first output, and the second input indicates a different voltage level for the voltage at the first output.

10. The method of claim 1, further comprising:

setting a first output voltage of the first stage of the multi-stage power converter to a first voltage level that is equal to the voltage level;

switching an input voltage of the audio amplifier of the portable device to the first output voltage;

determining, at a different time, that at least one of: (iii) a second amplitude of the audio signal is greater than the loudness threshold, or (iv) a second frequency of the audio signal is smaller than the frequency threshold;

setting the first output voltage of the first stage of the multi-stage power converter to a second voltage level that is higher than the first voltage level;

supplying, from a power source to the multi-stage power converter, a second amount of power according to the second voltage level;

setting a second output voltage of the second stage of the multi-stage power converter to the first voltage level; and switching the input voltage of the audio amplifier to the second output voltage.

11. The method of claim 1, further comprising:

determining, by a processor of the portable device based at least in part on the amplitude or the frequency, a switch state of a switch set coupled with the multi-stage power converter and the audio amplifier, wherein the audio amplifier is coupled with the first stage via a first switch of the switch set based at least in part on the switch state, and wherein the audio amplifier is decoupled from the second stage via a second switch of the switch set based at least in part on the switch state.

12. The method of claim 11, wherein the first switch is coupled with a boost converter, wherein the second switch is coupled with a buck converter, and wherein the multi-stage power converter comprises the boost converter and the buck converter.

13. A portable device comprising: a power source; a multi-stage power converter; a processor; and a memory storing instructions that, upon execution by the processor, configure the portable device to: determine that an audio signal to be output by the portable device has at least one of: (i) an amplitude that is less than a loudness threshold, or (ii) a frequency that is greater than a frequency threshold; set a voltage at a first stage of the multi-stage power converter to a voltage level based at least in part on the amplitude or the frequency; amplify, via an audio amplifier, the audio signal by at least coupling the audio amplifier with the first stage, decoupling the audio amplifier from a second stage of the multi-stage power converter, and supplying, from the power source to the multi-stage power converter, an amount of power based at least in part on the voltage level; and output the audio signal based at least in part on the amplification.

14. The portable device of claim 13, wherein the multi-stage power converter comprises a boost converter and a buck converter that are in series, and wherein an input of the boost converter is electrically coupled with the power source.

15. The portable device of claim 14, further comprising an audio amplifier and a set of switches, wherein the set of switches is electrically coupled with the boost converter, the buck converter, and the audio amplifier.

16. The portable device of claim 15, wherein the output indicates the voltage at an output of the boost converter, wherein the output of the boost converter is electrically coupled with an input of the buck converter.

17. The portable device of claim 16, wherein the memory stores further instructions that, upon execution by the processor, configure the processor to also: generate a second output indicating a switch state, wherein the switch state indicates whether the input of the audio amplifier is to be electrically coupled with the output of the boost converter or an output of the buck converter.

18. The portable device of claim 13, wherein the memory stores further instructions that, upon execution by the processor, configure the processor to also: receive a second input indicating that an external power source is electrically coupled with the power source; and generate a second output indicating that a second voltage level for the voltage based at least in part on the second input.

19. A non-transitory computer readable medium storing instructions, that upon execution on a portable device, cause the portable device to:

determine that an audio signal to be output by the portable device has at least one of: (i) an amplitude that is less than a loudness threshold, or (ii) a frequency that is greater than a frequency threshold;

set a voltage at a first stage of a multi-stage power converter of the portable device to a voltage level based at least in part on the amplitude or the frequency;

amplify, via an audio amplifier, the audio signal by at least coupling the audio amplifier with the first stage, decoupling the audio amplifier from a second stage of the multi-stage power converter, and supplying, to the multi-stage power converter, an amount of power based at least in part on the voltage level at the first stage; and output, by a speaker, the audio signal based at least in part on the amplification.

20. The non-transitory computer readable medium of claim 19 further storing additional instructions, that upon execution on the portable device, cause the portable device to:

determine that a power source external to the portable device is electrically coupled with the portable device;

set the voltage to a second voltage level based at least in part on the power source being electrically coupled; and output the voltage at the second voltage level to the audio amplifier of the portable device.

* * * * *